(12) United States Patent
Ho et al.

(10) Patent No.: US 9,502,366 B2
(45) Date of Patent: Nov. 22, 2016

(54) SEMICONDUCTOR STRUCTURE WITH UBM LAYER AND METHOD OF FABRICATING THE SAME

(71) Applicant: UNITED MICROELECTRONICS CORP., Hsin-Chu (TW)

(72) Inventors: Kai-Kuang Ho, Hsin-Chu (TW); Chen-Hsiao Wang, Hsinchu (TW); Yi-Feng Hsu, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/609,412

(22) Filed: Jan. 29, 2015

(65) Prior Publication Data

US 2016/0190077 A1    Jun. 30, 2016

(30) Foreign Application Priority Data

Dec. 26, 2014   (TW) .............................. 103145829 A

(51) Int. Cl.
*H01L 23/52* (2006.01)
*H01L 23/00* (2006.01)

(52) U.S. Cl.
CPC .............. *H01L 24/05* (2013.01); *H01L 24/03* (2013.01); *H01L 2224/0312* (2013.01); *H01L 2224/0361* (2013.01); *H01L 2224/0401* (2013.01); *H01L 2224/05005* (2013.01); *H01L 2224/05017* (2013.01)

(58) Field of Classification Search
CPC ............. H01L 2224/0401; H01L 2224/73204
USPC ........................................... 257/737; 438/613
See application file for complete search history.

(56) References Cited

U.S. PATENT DOCUMENTS

| 7,968,445 | B2 | 6/2011 | Lin | |
| 2006/0202331 | A1* | 9/2006 | Hu | H01L 21/4853 257/737 |
| 2007/0045848 | A1 | 3/2007 | Tai | |
| 2008/0151519 | A1* | 6/2008 | Sakamoto | H01L 21/4846 361/764 |
| 2011/0019141 | A1* | 1/2011 | Yoon | G02F 1/1345 349/138 |

* cited by examiner

*Primary Examiner* — Dung Le
(74) *Attorney, Agent, or Firm* — Winston Hsu; Scott Margo

(57) ABSTRACT

A semiconductor structure with an under bump metallization (UBM) layer is provided. The semiconductor structure at least includes a substrate, a metal pad disposed on the substrate, an insulating layer covering the substrate and an edge of the metal pad, wherein at least one recess is disposed within the insulating layer and a first UBM layer contacts the metal pad. The recess is adjacent to the metal pad and the recess is in the shape of a ring. The first UBM layer contacts part of the recess.

11 Claims, 8 Drawing Sheets

SEMICONDUCTOR STRUCTURE WITH UBM LAYER AND METHOD OF FABRICATING THE SAME

BACKGROUND OF THE INVENTION

1. Field of the Invention

The present invention relates to a semiconductor structure with an under bump metallization (UBM) layer and a method of fabricating the same, and more particularly to a semiconductor structure which can prevent voids in the UBM layer and a method of fabricating the same.

2. Description of the Prior Art

Modern integrated circuits are made up of millions of active and/or passive devices such as transistors and capacitors. These devices are initially isolated from each other, but are later interconnected to form functional circuits. Interconnections are increasingly determining the limits of performance and the density of modern integrated circuits. Bumps are formed on top of the interconnections so that the integrated circuit devices can be accessed.

In a typical bump formation process, a UBM layer is formed, followed by the formation of a bump on the UBM layer. The UBM layer formation includes performing a plating step to plate metal layers on the exposed portion of a metal pad. It has been found, however, that the bottom of the plated layers is rough, with voids formed therein. As a consequence, the reliability of the resulting bumps is degraded.

SUMMARY OF THE INVENTION

In view of the above, an objective of the present invention is to provide a method and a structure to prevent these voids.

According to a preferred embodiment of the present invention, a semiconductor structure with an under bump metallization layer includes a substrate, a metal pad disposed on the substrate, and an insulating layer covering the substrate and an edge of the metal pad with at least one recess disposed within the insulating layer, wherein the recess is adjacent to the metal pad, and the recess is in the shape of a ring. The semiconductor structure with an under bump metallization layer further comprises a first under bump metallization layer contacting the metal layer wherein the first under bump metallization layer also contacts part of the recess.

According to another preferred embodiment of the present invention, a fabricating method of a semiconductor structure with an under bump metallization layer includes providing a substrate. A metal pad is formed on the substrate. Later, an insulating layer is formed to cover the substrate and the metal pad. Subsequently, a first patterning process is performed to remove part of the insulating layer so that the metal pad is exposed. After that, a second patterning process is performed to remove part of the insulating layer to form at least one recess adjacent to the metal pad within the insulating layer, wherein the recess is in the shape of a ring. Finally, an under bump metallization layer is formed to contact the metal mad and fill in part of the recess.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
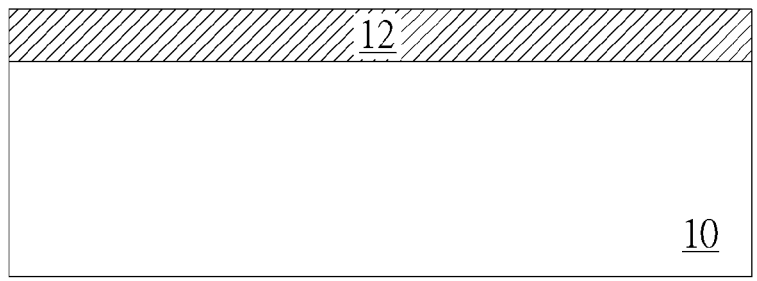
FIG. 1 to FIG. 7 schematically depict a fabricating method of a semiconductor structure with an under bump metallization layer according to a first embodiment of the present invention.
Figure 2:
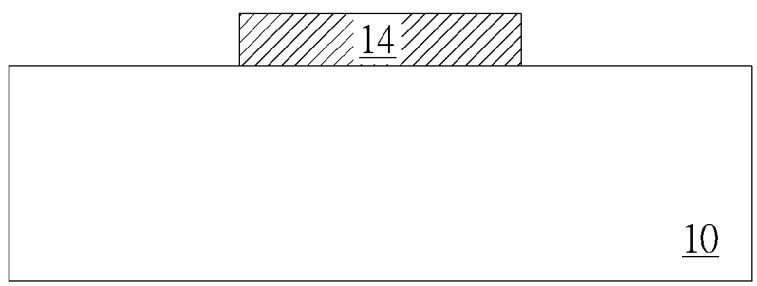
Figure 3:
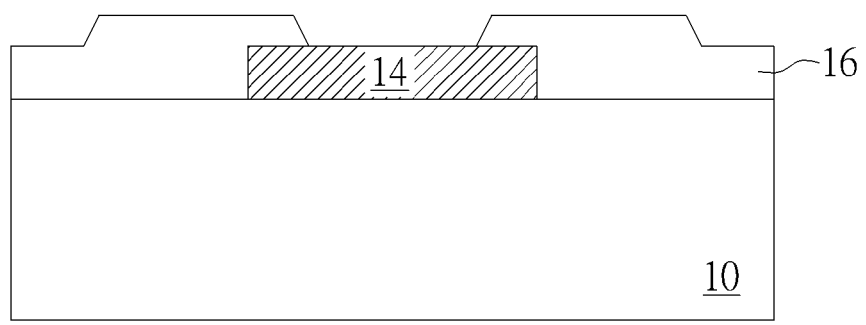
Figure 4:
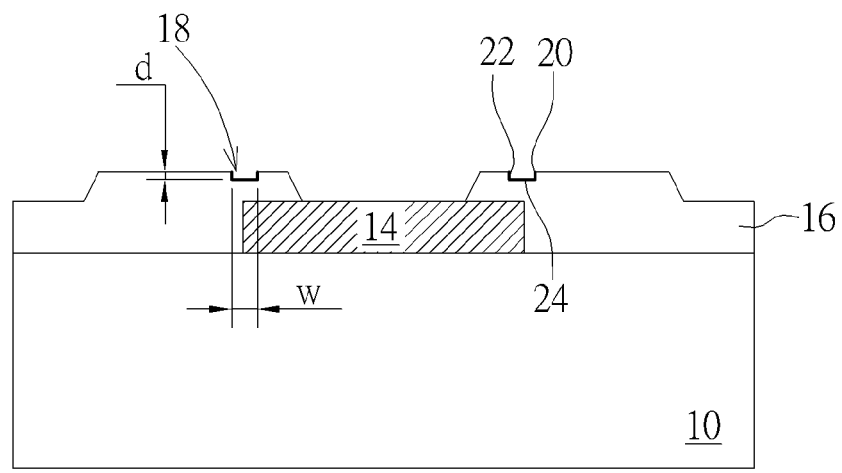
Figure 5:
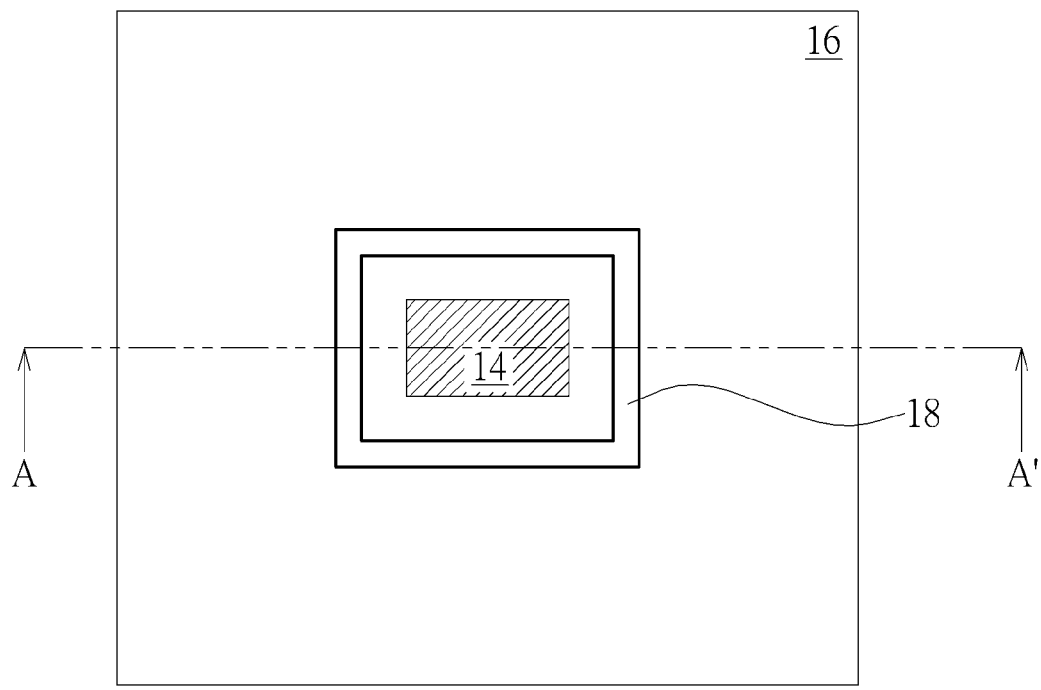
Figure 6:
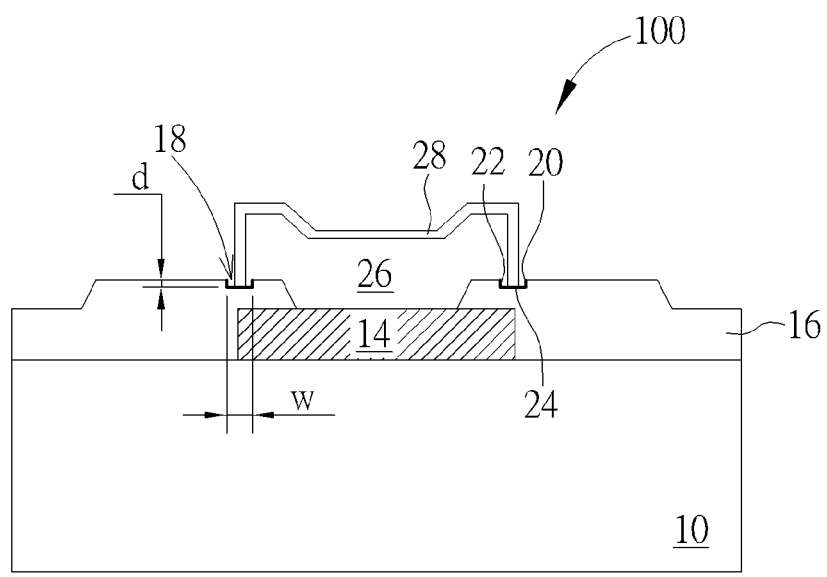
Figure 7:
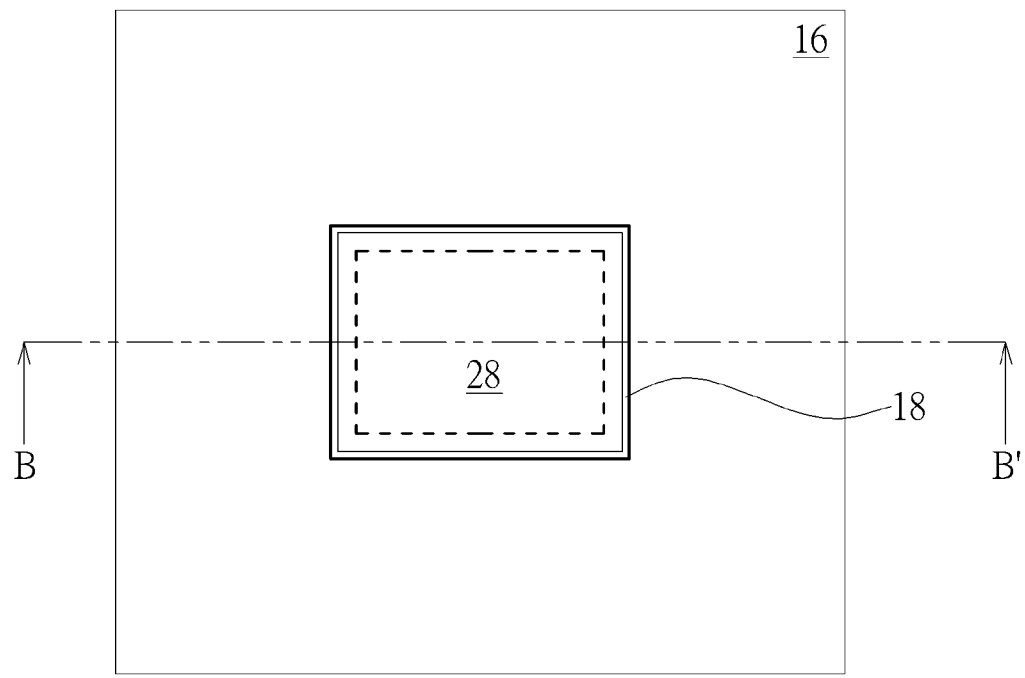

FIG. 1 to FIG. 7 schematically depict a fabricating method of a semiconductor structure with an under bump metallization layer according to a first embodiment of the present invention, wherein FIG. 4 is a sectional view along line AA' in FIG. 5, and FIG. 6 is a sectional view along line BB' in FIG. 7. As shown in FIG. 1, a substrate 10 is provided. Then, a metal layer 12 is formed on the substrate 10. The substrate 10 may include completed metal layer interconnections (not shown). The metal layer 12 will serve as bonding pads. Moreover, the substrate 10 may be an interposer. According to a preferred embodiment of the present invention, the metal layer 12 is aluminum, but is not limited thereto; the metal layer can be formed of any conductive material. As shown in FIG. 2, the metal layer 12 is patterned to form a metal pad 14. The metal pad 14 has a continuous profile. As shown in FIG. 3, an insulating layer 16 conformally covers the substrate 10 and the metal layer 14. Later, a first patterned process, such as a lithographic process, is performed to remove part of the insulating layer 16 to expose the metal layer 14. The remaining insulating layer 16 can optionally partly cover the metal pad 14. As shown in FIG. 4 and FIG. 5, a second patterned process, such as another lithographic process, is performed to format least one recess 18 (marked by bold lines in the figures) within the insulating layer 16. The recess 18 is preferably in the shape of a closed ring. The recess 18 is preferably formed within the insulating layer 16 adjacent to the metal pad 14. The recess 18 can also be formed on the insulating layer 16 overlapping an edge of the metal pad 14. The recess 18 can be a rectangular ring but is not limited thereto. The recess 18 can also be a circular ring, an octagonal ring or other suitable shapes. When the insulating layer 16 is etched to form the recess 18, the depth of the recess 18 needs to be within a certain size so that it can be entirely defined by the insulating layer 16, and the sidewalls 20/22 and the bottom 24 of the recess 18 are all formed by the insulating layer 16. In this case, the metal pad 14 will not be exposed through the recess 18. According to a preferred embodiment of the present invention, the depth d of the recess 18 is about 0.1 μm, and the width W of the bottom 24 is around 0.2 μm.

As shown in FIG. 6, a first under bump metallization layer 26 is formed to contact the metal pad 14 and the first under bump metallization layer 26 extends from the metal pad 14 to part of the recess 18. More specifically, the recess 18 includes a bottom 24 and two sidewalls 20/22. The first under bump metallization layer 26 contacts the sidewall 22 and part of the bottom 24. In other cases, the first under bump metallization layer 26 contacts two sidewalls 20/22 and the entire bottom 24. According to a preferred embodiment of the present invention, the first under bump metallization layer 26 contacts at least half of the width W of the bottom 24. The method of forming the first under bump metallization layer 26 may include a traditional electroless plating process. The electroless plating process can be performed by using suitable metal salts as plating solution, and a reducing agent can be used optionally based on different plating solutions. The first under bump metallization layer 26 is preferably nickel. Because at least one recess 18 is formed within the insulating layer 16, the first under bump metallization layer 26 cannot only be attached on the top surface of the insulating layer 16 but can also extend to the sidewalls 20/22 and the bottom 24 of the recess 18 to increase the contact area between the first under bump metallization layer 26 and the insulating layer 16. Due to the physical difference between the first under bump metallization layer 26 and the insulating layer 16, the first under bump metallization layer 26 cannot attach on the insulating layer 16 well. Therefore, by increasing the contact area between the first under bump metallization layer 26 and the insulating layer 16, the first under bump metallization layer 26 can better attach on the insulating layer 16. The first under bump metallization layer 26 is a continuous metal structure. After the first under bump metallization layer 26 is completed, a second under bump metallization layer 28 is formed to conformally contact the first under bump metallization layer 26. The second under bump metallization layer 28 contacts part of the bottom 24 of the recess 18. Similarly, the second under bump metallization layer 28 can be formed by a traditional electroless plating process. The electroless plating process can be performed by using suitable metal salts as plating solution, and a reducing agent can be used optionally based on different plating solutions. The second under bump metallization layer 28 may be palladium. In addition, as shown in FIG. 7, the second under bump metallization layer 28 in the recess 18 has a continuous profile. Therefore, the under bump metallization layer 26 conformally covered by the second under bump metallization layer 28 has a continuous profile in the recess 18. The first under bump metallization layer 26 in the recess 18 also forms a closed ring. Next, a third under bump metallization layer (not shown) is formed by an electroless plating process. The third under bump metallization layer is preferably gold. During the formation of the third under bump metallization layer, the second under bump metallization layer 28 needs to be immersed in a gold-containing plating solution. Because gold atoms are small, the gold atom can easily penetrate the interface between the palladium and the insulating layer 16 and reach the first under bump metallization layer 26, such as nickel. The gold atom and the nickel will react to form voids on the interface between the first under bump metallization layer 26 and the insulating layer 18. In the end, the electrical performance of the first under bump metallization layer 26 will deteriorate because of the voids. The present invention overcomes this problem by adding at least one recess 18 in the insulating layer 16. The gold atoms therefore have to go through the sidewalls 20/22 and the bottom 24 of the recess 18 before reaching a region within the first under bump metallization layer 26 which influences the electrical performance. In addition, even when voids are formed in the first under bump metallization layer 26 within the recess 18, the voids will not damage the electrical performance of the solder bump formed later, because voids are far from the center of the first under bump metallization layer 26. After the third under bump metallization layer is formed, a solder bump may be formed on the third under bump metallization layer.

Figure 8:
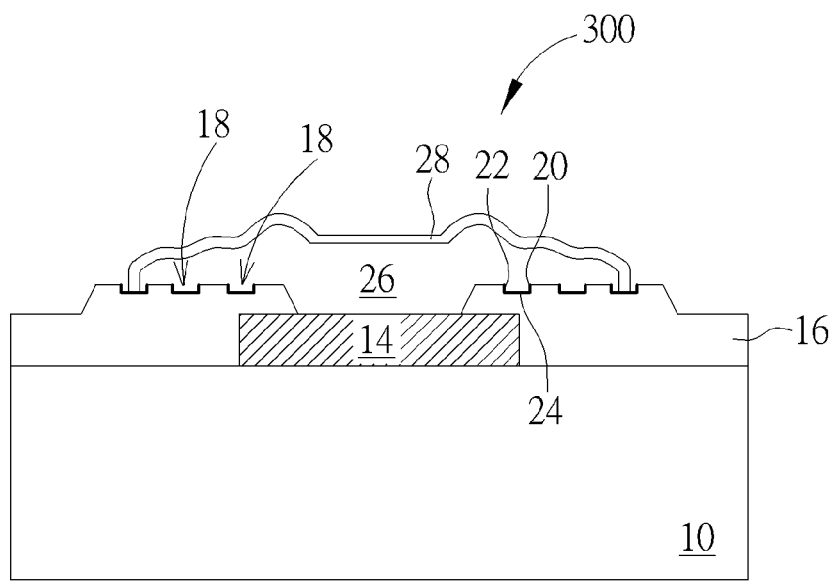
FIG. 8 to FIG. 9 schematically depict a fabricating method of a semiconductor structure with an under bump metallization layer according to a second embodiment of the present invention.
Figure 9:
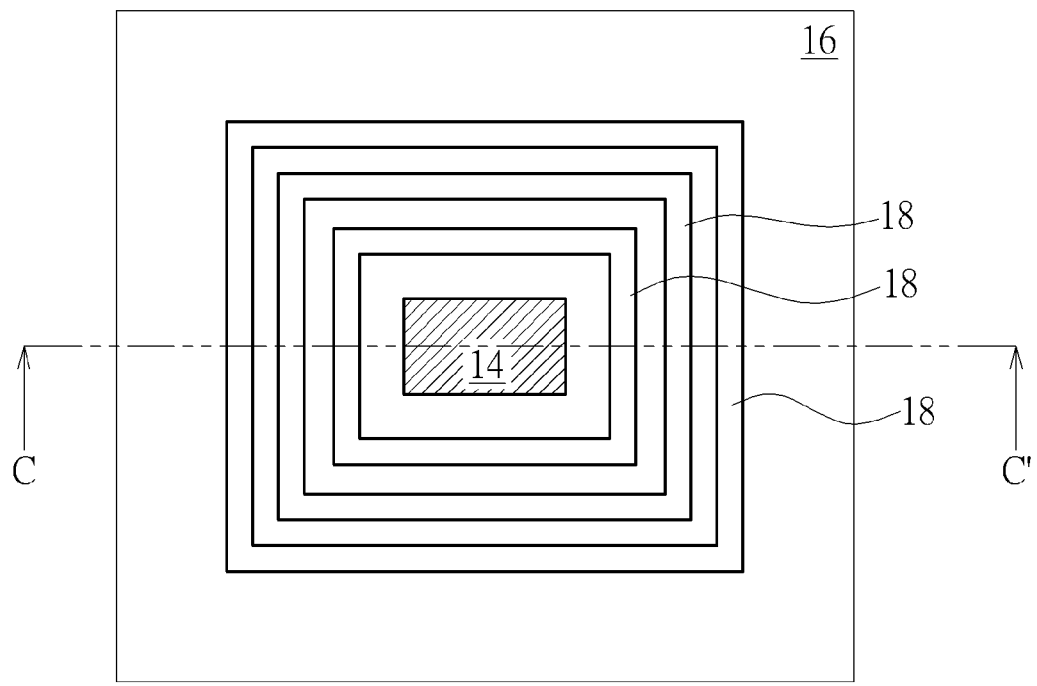

FIG. 8 to FIG. 9 schematically depict a fabricating method of a semiconductor structure with an under bump metallization layer according to a second embodiment of the present invention, wherein like reference numerals are used to refer to like elements throughout. FIG. 8 is a sectional view along line CC' illustrated in FIG. 9. For the sake of brevity, only the insulating layer 16 and the metal pad 14 are shown in FIG. 9, and other elements are omitted. The difference between the second embodiment and the first embodiment is that numerous recesses 18 instead of one recess 18 are formed during the second patterned process in the second embodiment. The recesses 18 shown in FIG. 8 are largely the same as the recess 18 shown in FIG. 4. The recess 18 which is relatively more distant from the metal pad 14 surrounds the recess 18 which is relatively nearer the metal pad 14. Each recess 18 has a bottom 24 and two sidewall 20/22. The first under bump metallization layer 26, which is formed later, contacts at least one bottom 20 and one sidewall 22. The recess 18 which is the most distant from the metal pad 14 has a sidewall 20 which is not covered by the first under bump metallization layer 26. In other cases, the first under bump metallization layer 26 may contact the bottoms 24 and the sidewalls 20/22 of each of the recesses 18. In the second embodiment, gold atoms need to move along the profile of the recesses 18 to reach a region within the first under bump metallization layer 26, where they may deteriorate the electrical performance of the first under bump metallization layer 26. In other words, the route is elongated, so it is more difficult for the gold atoms to reach this area. Moreover, even when voids are formed in the first under bump metallization layer 26 within the recesses 18, the voids will not damage the electrical performance of the solder bumps, which are formed later.

Figure 10:
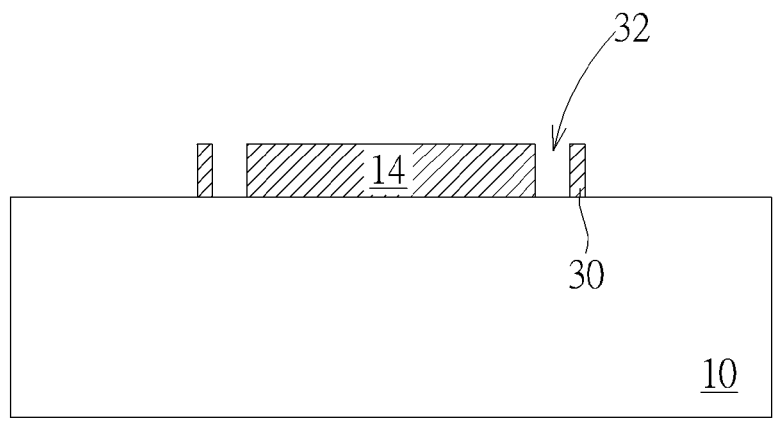
FIG. 10 to FIG. 13 schematically depict a fabricating method of a semiconductor structure with an under bump metallization layer according to a third embodiment of the present invention.
Figure 11:
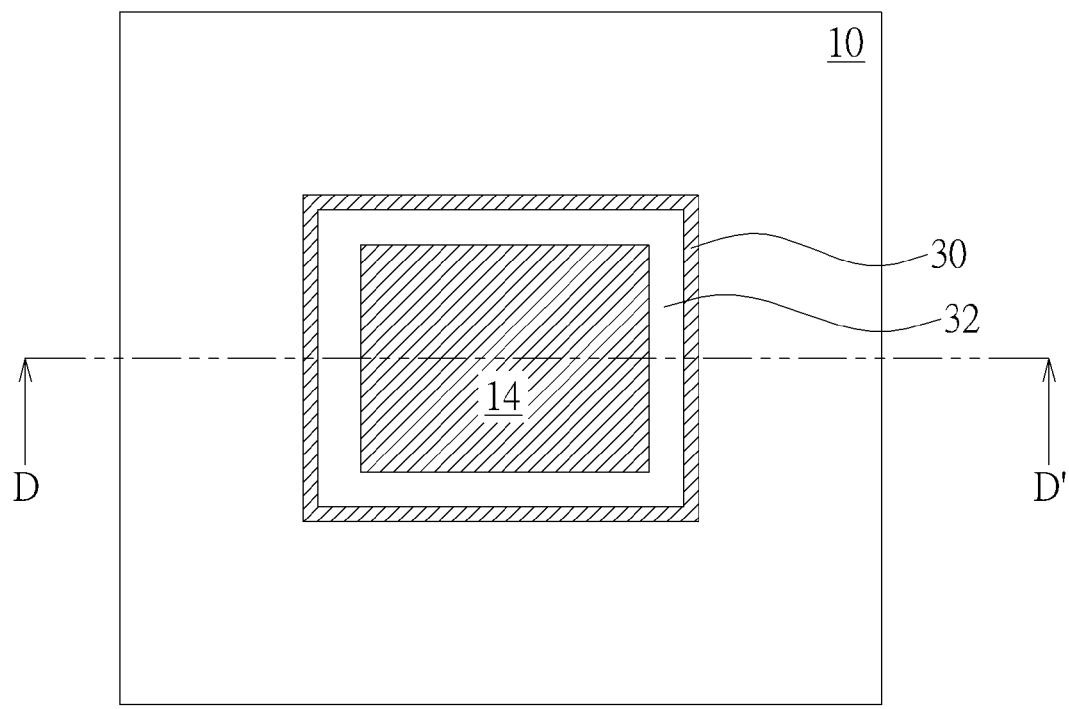
Figure 12:
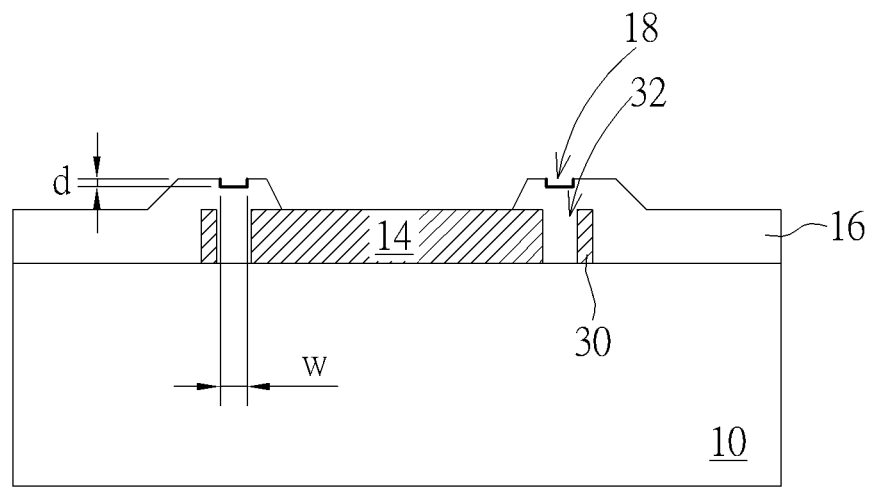

FIG. 1 and FIG. 10 to FIG. 13 schematically depict a fabricating method of a semiconductor structure with an under bump metallization layer according to a third embodiment of the present invention, wherein like reference numerals are used to refer to like elements throughout. FIG. 10 is a sectional view along line DD' illustrated in FIG. 11. As shown in FIG. 1, a substrate 10 is provided. Then, a metal layer 12 is formed on the substrate 10. According to a preferred embodiment of the present invention, the metal layer 12 is aluminum, but this is not limited thereto, and any conductive material can be the metal layer. As shown in FIG. 10 and FIG. 11, the metal layer 12 is patterned to form a metal pad 14 and at least one metal ring 30 surrounding the metal pad 14. A first trench 32 is defined between the metal pad 14 and the metal ring 30. The metal ring 30 is preferably in the shape of a closed ring, such as a rectangular ring, circular ring, octagonal ring or other suitable shapes. The first trench 32 is also in the shape of a closed ring. As shown in FIG. 12, an insulating layer 16 is formed to conformally cover the substrate 10, the metal layer 14 and the metal ring 30. The insulating layer 16 fills the first trench 32 so that the surface of the insulating layer 16 forms a recess 18, which overlaps the first trench 32. According to a preferred embodiment of the present invention, the depth d of the recess 18 is about 0.1 μm, and the width W of the bottom 24 is around 0.2 μm. Next, a patterned process such as a lithographic process is performed to remove part of the insulating layer 16 to expose the metal layer 14. The remaining insulating layer 16 can optionally partly cover the metal pad 14. In addition, because the recess 18 is formed by shaping the insulating layer 16 with the profile of the first trench 32, the recess 18 is also in the shape of a ring like the first trench 32. FIG. 5 is an illustration of the top view of the recess 18. The recess 18 is preferably formed on the insulating layer 16 which is adjacent to the metal pad 14.

Figure 13:
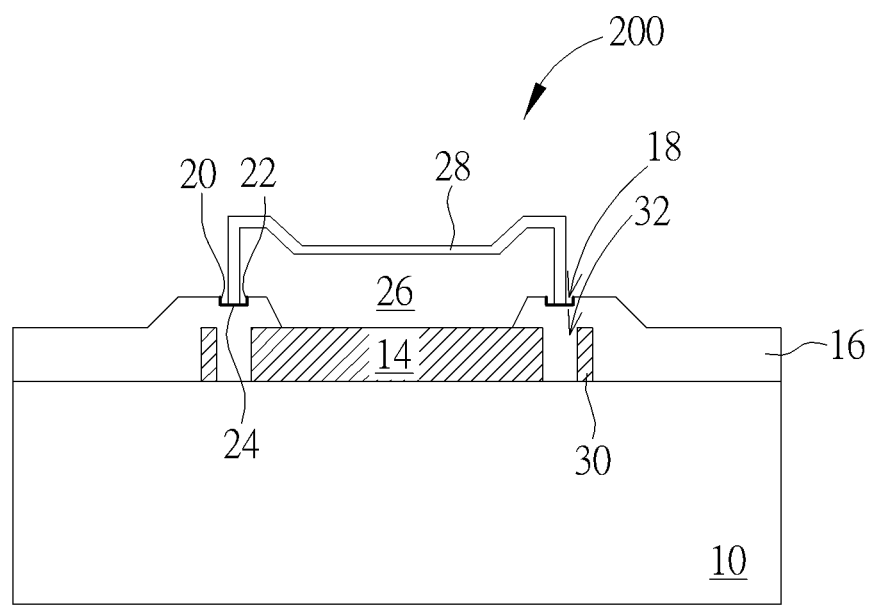

FIG. 13 is a sectional view along line BB' illustrated in FIG. 7. A first under bump metallization layer 26 is formed on the metal pad 14 by a traditional electroless plating process. The first under bump metallization layer 26 contacts the metal pad 14 and extends to cover part of the recess 18. Later, a second under bump metallization layer 28 is formed to conformally contact the first under bump metallization layer 26 by another traditional electroless plating process. The position, the material and the fabricating method of the first under bump metallization layer 26 and the second under bump metallization layer 28 are basically the same of that in FIG. 6 and FIG. 7, and therefore details are omitted herein. After the first under bump metallization layer 26 and the second under bump metallization layer 28 are completed, a third under bump metallization layer (not shown) is formed. The third under bump metallization layer is preferably gold. Because at least a recess 18 is added to the insulating layer 16, the gold atoms need to travel a long distance to reach a region on the first under bump metallization layer 26 where they may influence the electrical performance.

Figure 14:
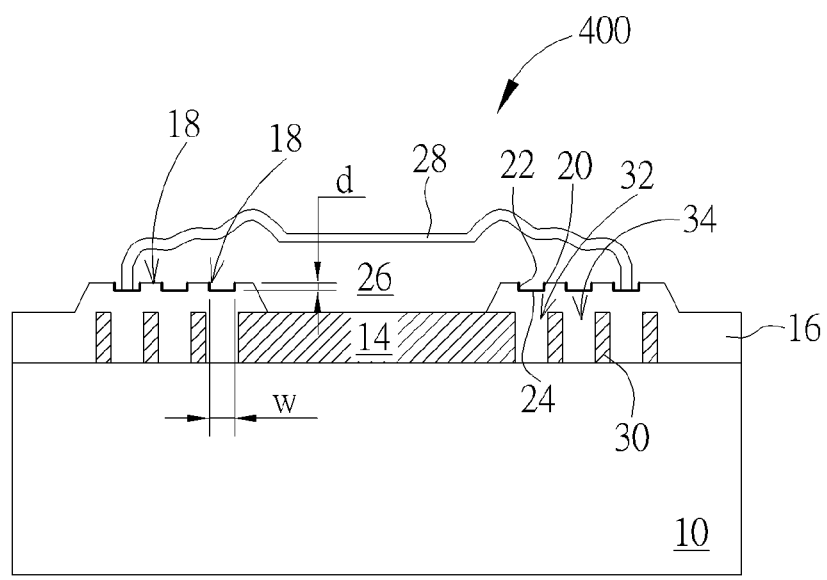
FIG. 14 to FIG. 15 schematically depict a fabricating method of a semiconductor structure with an under bump metallization layer according to a fourth embodiment of the present invention.
Figure 15:
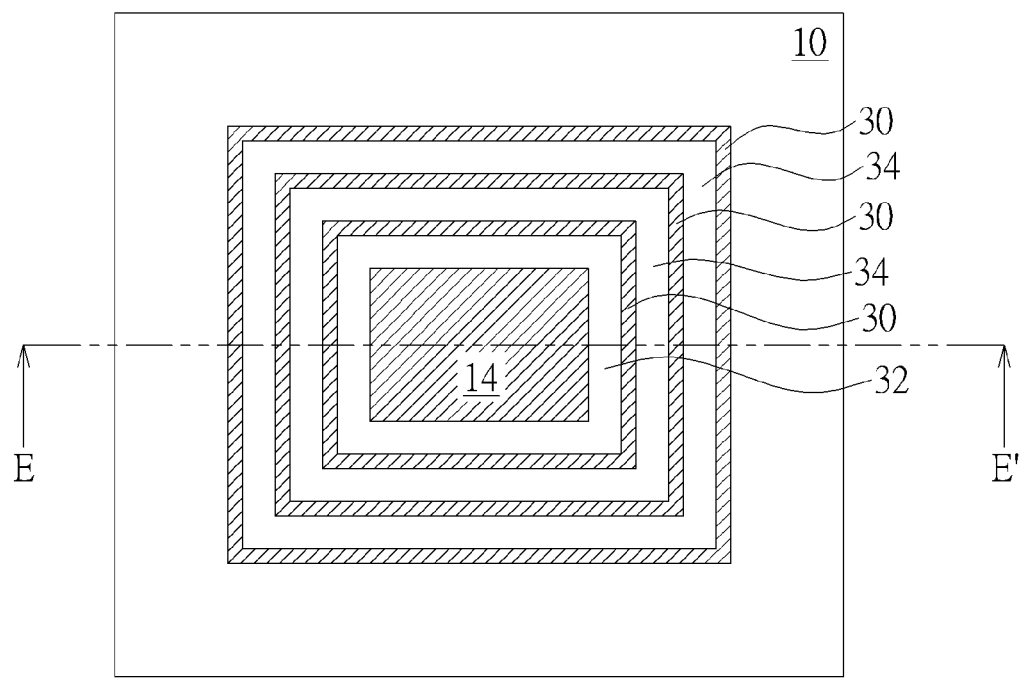

FIG. 14 to FIG. 15 schematically depict a fabricating method of a semiconductor structure with an under bump metallization layer according to a fourth embodiment of the present invention, wherein like reference numerals are used to refer to like elements throughout. FIG. 14 is a sectional view along line EE' illustrated in FIG. 15. For the sake of brevity, only the substrate 10, the metal pad 14 and the metal ring 30 are shown in FIG. 15, and other elements are omitted. As shown in FIG. 14 and FIG. 15, the metal layer 12 is patterned to form a metal pad 14 and numerous metal rings 30 surrounding the metal pad 14. Unlike the third embodiment, only one metal ring 30 is formed together with the metal pad 14. In the fourth embodiment, numerous metal rings 30 are formed. Each metal ring 30 surrounds the metal pad 14. The metal ring 30 which is relatively more distant from the metal pad 14 surrounds the metal ring 30 which is relatively nearer the metal pad 14. A second trench 34 is defined between the adjacent metal rings 30. Later, an insulating layer 16 is formed to conformally cover the substrate 10, the metal pad 14, the metal rings 30. The insulating layer 16 fills the first trench 32 and the second trench 34 so that the surface of the insulating layer 16 forms numerous recesses 18. In this embodiment, the bottom 24 of each recess 18 has the same depth d and width W. Based on different requirements, however, the depth d and width W of the bottom 24 of each recess 18 can be changed by adjusting the distance between two metal rings 30. Later, part of the insulating layer 16 is removed to expose the metal layer 14. Then, a first under bump metallization layer 26, a second under bump metallization layer 28 and a third under bump metallization layer (not shown) are formed by traditional electroless plating processes. The fabricating method, the position, and the material of the first under bump metallization layer 26 and the second under bump metallization layer 28 are basically the same as that in FIG. 8 and FIG. 9.

According to a fifth embodiment of the present invention, a semiconductor structure with an under bump metallization layer 100 is provided. As shown in FIG. 6 and FIG. 7, a semiconductor structure with an under bump metallization layer includes a substrate 10. A metal pad 14 is disposed on the substrate 10. An insulating layer 16 covers the substrate 10 and an edge of the metal pad 14. At least one recess 18 is disposed within the insulating layer 16. The recess 18 is adjacent to the metal pad 14, and can even be within the insulating layer 16 overlapping the edge of the metal pad 14. As shown in FIG. 5, the recess 18 can be a rectangular ring but is not limited thereto. The recess 18 can also be a circular ring, octagonal ring or other suitable shapes. According to a preferred embodiment of the present invention, the depth d of the recess 18 is about 0.1 μm, and the width W of the bottom 24 is around 0.2 μm. The substrate 10 can be a bulk silicon substrate, a germanium substrate, a gallium arsenide substrate, a silicon germanium substrate, an indium phosphide substrate, a gallium nitride substrate, a silicon carbide substrate, or a silicon on insulator (SOI) substrate. The metal pad is preferably aluminum.

A first under bump metallization layer 26 contacts the metal pad 14 and extends from the metal pad 14 to contact part of the recess 18. More specifically, the recess 18 includes a bottom 24 and two sidewalls 20/22. The first under bump metallization layer 26 contacts the sidewall 22 and part of the bottom 24. In other cases, the first under bump metallization layer 26 contacts two sidewalls 20/22 and the entire bottom 24. According to a preferred embodiment of the present invention, the first under bump metallization layer 26 contacts at least half of the width W of the bottom 24. In addition, the second under bump metallization layer 28 conformally covers the first under bump metallization layer 26. The second under bump metallization layer 28 covers part of the bottom 24 of the recess 18. As shown in FIG. 7, the second under bump metallization layer 28 in the recess 18 has a continuous profile. Therefore, the under bump metallization layer 26 conformally covered by the second under bump metallization layer 28 has a continuous profile in the recess 18 as well. In this way, the first under bump metallization layer 26 in the recess 18 also forma closed ring. Moreover, the first under bump metallization layer 26 is a continuous metal structure. The first under bump metallization layer 26 is preferably nickel. The first under bump metallization layer 26 and the second under bump metallization layer 28 may be palladium.

According to the sixth embodiment of the present invention, a semiconductor structure with an under bump metallization layer 200 is provided. In this embodiment the semiconductor structure with an under bump metallization layer 200 can include a metal ring 30 surrounding the metal pad 14. A first trench 32 is defined between the metal pad 14 and the metal ring 30. The material constituting the metal ring 30 is preferably the same as the material constituting the metal pad 14. As shown in FIG. 11, the metal ring 30 is preferably in the shape of a closed ring, such as a rectangular ring, circular ring, octagonal ring or other suitable shapes. The first trench 32 is also in the shape of a closed ring. The recess 18 overlaps the first trench 32. Please refer to the description of the fifth embodiment for details of the metal pad 14, the first under bump metallization layer 26, the second under bump metallization layer 28 and other elements.

According to a seventh embodiment of the present invention, a semiconductor structure with an under bump metallization layer 300 is provided. As shown in FIG. 8 and FIG. 9, the semiconductor structure with an under bump metallization layer 300 may include numerous recesses 18 within the insulating layer 16. The recess 18 which is relatively more distant from the metal pad 14 surrounds the recess 18 which is relatively nearer the metal pad 14. Each recess 18 has a bottom 24 and two sidewalls 20/22. The first under bump metallization layer 26 contacts at least one bottom 20 and one sidewall 22. The recess 18 which is the most distant from the metal pad 14 has the sidewall 20 is not covered by the first under bump metallization layer 26. In other cases, the first under bump metallization layer 26 may contact the bottoms 24 and the sidewalls 20/22 of each of the recesses 18. In this embodiment, the bottom 24 of each recess 18 has the same depth d and width W. Based on different requirements, however, the depth d and width W of the bottom 24 of each recess 18 can be changed. Refer to the description of the fifth embodiment for details of the metal pad 14, the first under bump metallization layer 26, the second under bump metallization layer 28 and other elements.

According to an eighth embodiment of the present invention, a semiconductor structure with an under bump metallization layer 400 is provided. The semiconductor structure with an under bump metallization layer 400 includes numerous recesses 18 shaped by the metal rings 30 under the insulating layer 16. As shown in FIG. 14 and FIG. 15, numerous metal rings 30 can be disposed under the insulating layer 16. All the metal rings 30 surround the metal pad 14. The metal ring 30 which is relatively more distant from the metal pad 14 surrounds the metal ring 30 which is relatively nearer the metal pad 14. In addition, a first trench 32 is formed between the metal pad 14 and the metal ring 30 which is nearest to the metal pad 14 amongst the metal rings 30. A second trench 34 is disposed between adjacent metal rings 30. Each second trench 34 overlaps one recess 18. The first recess 32 also overlaps a recess 18. The profile of the first trench 32 and the second recesses 34 form the recesses 18 in the insulating layer 16 covered thereon. Please refer to the description of the fifth and seventh embodiments for details of the metal pad 14, the first under bump metallization layer 26, the second under bump metallization layer 28 and other elements.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure with an under bump metallization layer, comprising:
   a substrate;
   a metal pad disposed on the substrate;
   an insulating layer covering the substrate and an edge of the metal pad;
   at least one recess disposed within the insulating layer, wherein the recess is adjacent to the metal pad, and the recess is in a shape of a ring; and
   a first under bump metallization layer contacting the metal pad, wherein the first under bump metallization layer contacts part of the recess.

2. The semiconductor structure with an under bump metallization layer of claim 1, wherein the recess comprises a bottom and two sidewalls, and the first under bump metallization layer contacts one of the sidewalls and part of the bottom.

3. The semiconductor structure with an under bump metallization layer of claim 2, wherein the first under bump metallization layer contacts the sidewalls and the entire bottom.

4. The semiconductor structure with an under bump metallization layer of claim 1, wherein the first under bump metallization layer is a continuous metal structure.

5. The semiconductor structure with an under bump metallization layer of claim 1, further comprising a plurality of recesses disposed within the insulating layer.

6. The semiconductor structure with an under bump metallization layer of claim 5, wherein a recess which is relatively more distant from the metal pad surrounds a recess which is relatively nearer the metal pad.

7. The semiconductor structure with an under bump metallization layer of claim 5, wherein each of the recesses comprises a bottom and two sidewalls, and the first under bump metallization layer contacts all of the sidewalls and all of the bottoms.

8. The semiconductor structure with an under bump metallization layer of claim 5, wherein each of the recesses comprises a bottom and two sidewalls, the first under bump metallization layer contacts some of the bottoms and some of the sidewalls, and wherein a recess which is the most distant from the metal pad among all the recesses has at least one of the sidewalls not covered by the first under bump metallization layer.

9. A fabricating method of a semiconductor structure with an under bump metallization layer comprising:
   providing a substrate;
   forming a metal pad on the substrate;
   forming an insulating layer covering the substrate and the metal pad;
   performing a first patterning process to remove part of the insulating layer to expose the metal pad through the insulating layer;
   performing a second patterning process to remove part of the insulating layer to form at least one recess adjacent to the metal pad within the insulating layer, wherein the recess is in a shape of a ring; and
   forming an under bump metallization layer contacting the metal pad and filling part of the recess.

10. The fabricating method of a semiconductor structure with an under bump metallization layer of claim 9, wherein when performing the second patterning process, a plurality of recesses are formed within the insulating layer and adjacent to the metal pad, and wherein among the recesses, a recess which is relatively more distant from the metal pad surrounds a recess which is relatively nearer the metal pad.

11. The fabricating method of a semiconductor structure with an under bump metallization layer of claim 9, wherein the under bump metallization layer covers the recesses.

* * * * *